United States Patent
Landsberger et al.

(10) Patent No.: US 7,951,721 B2
(45) Date of Patent: May 31, 2011

(54) ETCHING TECHNIQUE FOR CREATION OF THERMALLY-ISOLATED MICROSTRUCTURES

(76) Inventors: Leslie M. Landsberger, Westmount (CA); Oleg Grudin, Montreal (CA); Jens Urban, Erfurt (DE); Uwe Schwarz, Niedemissa (DE)

( * ) Notice: Subject to any disclaimer, the term of this patent is extended or adjusted under 35 U.S.C. 154(b) by 737 days.

(21) Appl. No.: 11/667,008

(22) PCT Filed: Nov. 10, 2005

(86) PCT No.: PCT/CA2005/001726
§ 371 (c)(1),
(2), (4) Date: Nov. 20, 2007

(87) PCT Pub. No.: WO2006/050607
PCT Pub. Date: May 18, 2006

(65) Prior Publication Data
US 2008/0179713 A1  Jul. 31, 2008

Related U.S. Application Data

(60) Provisional application No. 60/626,466, filed on Nov. 10, 2004.

(51) Int. Cl.
*H01L 21/461* (2006.01)
(52) U.S. Cl. .............. 438/704; 438/734; 257/E21.214
(58) Field of Classification Search ............ 438/704, 438/734; 257/E21.214
See application file for complete search history.

(56) References Cited

U.S. PATENT DOCUMENTS

| | | | |
|---|---|---|---|
| 4,990,986 A | 2/1991 | Murakami et al. | |
| 5,594,172 A * | 1/1997 | Shinohara | 73/514.33 |
| 5,600,174 A | 2/1997 | Reay et al. | |
| 7,119,656 B2 | 10/2006 | Landsberger et al. | |
| 7,249,409 B2 | 7/2007 | Landsberger et al. | |
| 2002/0033519 A1 | 3/2002 | Babcock et al. | |
| 2006/0097276 A1 | 5/2006 | Chen et al. | |
| 2007/0246455 A1 | 10/2007 | Landsberger et al. | |
| 2007/0261232 A1 | 11/2007 | Landsberger et al. | |

FOREIGN PATENT DOCUMENTS
WO  WO03023794  3/2003

OTHER PUBLICATIONS

International Search Report dated Mar. 2, 2006 from International Patent Application No. PCT/CA2005/001726.
Parameswaran et al., "Micromachined Thermal Radiation Emitter from a Commercial CMOS Process", IEEE Electron Device Letters, vol. 12, No. 2, Feb. 1991.
Amemiya et al., "Electrical Trimming of Heavily Doped Polycrystalline Silicon Resistors", IEEE Transactions on Electron Devices, vol. ED-26, No. 11, Nov. 1979.

(Continued)

*Primary Examiner* — Jack Chen
(74) *Attorney, Agent, or Firm* — Ogilvy Renault LLP

(57) ABSTRACT

There is described a method for creating a thermally-isolated microstructure on a slab of mono-crystalline silicon which uses a hybrid dry-then-wet etch technique that when controlled, can produce microstructures without any silicon adhering underneath, microstructures having small masses of silicon adhering underneath, and microstructures that are still attached to the slab of mono-crystalline silicon via a waisted silicon body. When creating the microstructures with a waisted silicon body, the thermal isolation of the microstructure can be designed by controlling the depth of the etching and the size of the waist.

13 Claims, 11 Drawing Sheets

OTHER PUBLICATIONS

Chu et al., "Fabrication of 3D Microstructures and Microactuators on (100) SOI Wafer Using the DAWN Process", Power Mechanical Engineering Department, National Tsing Hua University, Taiwan, IEEE 2004.

Offereins et al., "Methods for the Fabrication of Convex Corners in Anisotropic Etching of (100) Silicon in Aqueous KOH", Fraunhofer Institut für Festkorpertechnologue, Sensors and Actuators, 1991.

Reay et al., "Thermally and Electrically Isolated single Crystal Silicon Structures in CMOS Technology", IEEE Electron Device Letters, vol. 15, No. 10, Oct. 1994.

Wu et al., "Compensating Corner Undercutting in Anisotropic Etching of (100) Silicon", Sensors and Actuators, vol. 18, pp. 207-215 (1989).

Nikpour et al., "Concave corner compensation between vertical (010)-(001) planes anisotropically etched in Si (100)", Sensors and Actuators A: Physical, vol. 66/1-3, pp. 299-307 Apr. 1998.

Graf et al., "Digital MOS-Transistor-Based Microhotplate Array for Simultaneous Detection of Environmentally Relevant Gases", in the Proceedings of the MEMS 2004 Conference in Maastricht, Jan., IEEE 2004.

Nikpour et al., "Release-Control Structures for Cantilever-Based Sensors", Sensors and Materials, vol. 10, No. 5, pp. 287-296, Oct. 1998.

Grudin et al., "CMOS-compatible high-temperature micro-heater: Microstructure release and testing", Canadian Journal of Elec. and Comp. Engineering, vol. 25, No. 1 pp. 29-34, (2000).

* cited by examiner

ETCHING TECHNIQUE FOR CREATION OF THERMALLY-ISOLATED MICROSTRUCTURES

CROSS-REFERENCE TO RELATED APPLICATIONS

This application claims priority of U.S. Provisional Patent Application No. 60/626,466, filed on Nov. 10, 2004.

TECHNICAL FIELD

The present invention relates to the field of thermally isolated microstructures on a slab of mono-crystalline silicon, and more particularly, to etching techniques used to release the microstructures in the fabrication process.

BACKGROUND OF THE INVENTION

Thermally-isolated circuit elements have been developed and made in several ways. Reay et al ("Thermally and Electrically Isolated Single Crystal Silicon Structures in CMOS Technology" R. J. Reay, E. H. Klaassen, G. T. A. Kovacs, IEEE Electron Device Letters Vol. 15, No. 10, October 1994, pp. 399-401; U.S. Pat. No. 5,600,174 "Suspended Single Crystal Silicon Structures and Method of Making Same"), have shown that electrochemical etching of silicon can be used to create small masses of thermally-isolated silicon, in which circuit components could be housed. Such thermally-isolated circuit elements have the advantage that they can be heated independently of nearby circuit elements on the same chip or substrate. In this way, their operating temperature can be controlled independently without affecting the operation of other nearby circuit elements.

Reay et al's method of making such thermally-isolated silicon islands involves electrochemical etching of silicon, where electrodes need to be electrically connected to the islands while the device is in the etchant solution, and the islands are defined by a p-n junction implanted or diffused into the silicon. Also, others have demonstrated methods of processing silicon islands by other methods, such as "Digital MOS-Transistor-Based Microhotplate Array for Simultaneous Detection of Environmentally Relevant Gases" M. Graf, S. Taschini, P. Kaser, C. Hagleitner, A. Hierlemann, H. Baltes in the Proceedings of the MEMS 2004 Conference in Maastricht, January, 2004 p. 351, and M. Schneider, T. Muller, A. Haberli, M. Hornung, H. Baltes "Integrated Micromachined Decoupled CMOS Chip on Chip", Proceedings IEEE—The Tenth Annual (1997) International Workshop on Micro Electro Mechanical Systems (Cat. No. 97CH36021), (1997) pp. 512-517.

In these cases, the open areas are defined, the silicon is wet-etched, but the etchant does not attack the silicon masses which are protected by electrochemical etch-stop. In this way, the etchant attacks underneath these protected silicon volumes, releasing the suspended silicon block and films above it from the substrate. However, it must be noted that electrochemically-based etch-stopping requires that a potential be applied to the island regions via electrical contacts, continually throughout the wet-etching process.

Other researchers (Ducso, Vazsonyi, Adam, Szabo, Barsony, Gardeniers, van den Berg "Porous silicon bulk micromachining for thermally isolated membrane formation", Sensors and Actuators A 60 (1997) pp. 235-239; and U.S. Pat. No. 6,359,276 "Microbolometer infrared sensors", Tu Xiang Zheng), have created released silicon masses by creating a porous silicon layer beneath the intended silicon masses, and then selectively etching away the porous silicon layer. Again, the creation of porous silicon involves an electrochemical anodization process, which requires potential to be applied via electrical contacts during a wet-etch process.

Using the methods known in the art, it is not possible to create such silicon islands without using an electrochemical process, which involves the need for electrical connection to the silicon wafer during wet processing.

Consider a typical suspended microstructure such as used in thermal sensors, or trimmable resistor as depicted in FIG. 1a and 1b of International publication No. WO 03/023794. Such microstructures are typically made in a {100}-oriented silicon wafer, and released (suspended) over a cavity, by a wet anisotropic etch of the silicon underneath the microstructures. The cavity is etched along crystallographic surfaces governed by the anisotropy of the wet etch. Concave configurations tend to be bounded by slow-etch surfaces (usually {111}-family silicon surfaces), while convex configurations tend to be bounded by fast-etch surfaces. If the open silicon area is a simple rectangle (without any suspended microstructures), with the sides of the rectangle aligned with the intersection of {111} surfaces and the {100} wafer surface, then all of the silicon surfaces and surface-intersections inside the cavity will be generally flat or concave, and the resulting cavity will be bounded by only the downward-etching {100} surface, and {111}-family surfaces inclined at 54.7° from the wafer surface. Even if the open silicon area is not a rectangle, or not aligned as described above, then if one etches long enough, the resulting cavity will still intersect the surface in a rectangular pattern, bounded by {111}-family surfaces, which will be the outermost rectangle circumscribing the entire open silicon area.

When there are microstructures intended to be released (suspended) over the etched cavity, these microstructures must, by their presence, initially cover part of the surface of the silicon. In order for such a microstructure to be released, its shape must have certain features, such that it will be rapidly under-etched by etching of fast-etch surfaces underneath. For example, in the release of the three suspended microstructures shown in FIG. 2, the under-etching of the microstructures begins at the indicated convex points labeled "A". Also, microstructures whose edges are not aligned parallel to the intersection of {111}-family surfaces with the {100} wafer surface, such as at the locations labeled "B", will under-etch faster than {111}-family surfaces. In the case of the locations marked "B" in FIG. 2, the microstructure edges are aligned at roughly 45° from the intersection of {111}-family surfaces with the {100} wafer surface, and therefore will under-etch as either vertical {100}-family surfaces or 45°-inclined {110}-family surfaces, both much faster than the {111} (B. Nikpour, L. M. Landsberger, T. J. Hubbard, M. Kahrizi, A. Iftimie, "Concave Corner Compensation Between Vertical (010)-(001) Surfaces Anisotropically Etched in Si(100)," *Sensors and Actuators A: Physical*, Vol. 66/1-3, pp. 299-307 April 1998.)

At each convex location such as points "A", there will typically appear two fast-etch surfaces, intersecting at a sharp convex edge as shown in FIG. 3. At locations such as points "B", the portions of the microstructures will be relatively quickly under-etched, and the resulting structure will transform into a convex configuration with fast-etch surfaces intersecting at points such as the locations marked "C" in FIG. 2.

During the process of release (under-etch) of the microstructures, if there is stress in the films composing the microstructures, the already-released portions may bend, upward or downward, while the still-unreleased portions will be held fixed on the not-yet-etched silicon. Since the microstructures are most-often in the process of being released by under-etching at convex corners, and since these convex corners may be sharp, there may be severe concentration of stress at those points, which may lead to cracking of the microstructure layers. Therefore catastrophic damage (etching) of the embedded conductive traces may ensue, depending on where the cracks occur relative to the positions of the embedded conductors. (Ref: B. Nikpour, S. Naseh, L. M. Landsberger, M. Kahrizi, M. Paranjape, R. Antaki, J. F. Currie, "Release-Control Structures for Cantilever-Based Sensors," *Sensors and Materials*, Vol. 10, No. 5, pp. 287-296, October 1998.) Alternatively, at or near the end of the release process, the silicon underneath the microstructures may be sharp-pointed, and agitation of the etch solution may cause damaging impact with the microstructure. (Ref: O. Grudin, R. Marinescu, L. M. Landsberger, D. Cheeke, M. Kahrizi, "CMOS-Compatible High-Temperature Micro-Heater: Microstructure Release and Testing," *Canadian Journal of Elec. and Comp. Engineering*, Vol. 25, No. 1 pp. 29-34, (2000).)

Therefore, there is a need for a different etching technique, which reduces the risk of damage to the microstructure during the release process.

SUMMARY OF THE INVENTION

There is described a method of making an integrated circuit in a silicon substrate (in general, a substrate material which can be wet-etched anisotropically, such as those which have diamond or zincblende crystal lattice), such that islands of silicon are thermally-isolated from the remainder of the devices on the same substrate, without needing to attach electrodes and apply potentials during the etching of silicon.

There is also described a method of wet-anisotropic-etch releasing suspended microstructures composed of surface films found in an integrated circuit process (such as silicon dioxide, silicon nitride, and polysilicon), where film-stress-induced deformations are changed by the presence of adherent silicon, to avoid damaging the suspended microstructures during release.

There is described a method for creating a thermally-isolated microstructure on a substrate which uses a hybrid dry-then-wet etch technique that when controlled, can produce microstructures without any silicon adhering underneath, microstructures having small masses of silicon adhering underneath, and microstructures that are still attached to the substrate via a waisted silicon body. When creating the microstructures with a waisted silicon body, the thermal isolation of the microstructure can be designed by controlling the depth of the etching and the size of the waist.

In accordance with a first broad aspect of the present invention, there is provided a method for creating a thermally-isolated microstructure in a semiconductor chip, the method comprising: providing a patterned dielectric film on a slab of mono-crystalline silicon; dry-etching to remove silicon adjacent to the patterned dielectric film, thereby creating a structure at least partially surrounded by cavities having substantially vertical walls; and wet anisotropic etching the substantially vertical walls inwardly beneath said dielectric film to produce inverted side walls in the cavities, and thermally isolate the microstructure.

Various layout techniques can be used to create and/or optimize the microstructure produced using the above method. One layout technique involves designing the microstructure such that certain regions will be released before others, and such that it can be determined in what order the release will occur. Another involves designing the microstructure such that certain regions will remain connected vertically to the substrate even while other regions are already fully released without any adherent silicon. Another involves designing the microstructure such that certain regions will have remaining adherent silicon, not connected to the substrate, while other regions are already fully released without any adherent silicon. For example, a microstructure having two narrow support arms can release the support arms completely from the substrate while leaving the central portion attached to the substrate by silicon. Another layout technique involves designing the sizes of the various portions of the microstructure to provide different sized silicon islands underneath the microstructure. These layout techniques are put into effect by providing the dielectric film on the slab of silicon with specific layout arrangements and geometric parameters.

The step of providing a dielectric film on a slab of mono-crystalline silicon may comprise embedding at least one active device in the silicon. This device should be positioned such that it will not be etched away by the wet anisotropic etching, and will reside in the portion of silicon which will remain underneath the microstructure, thereby forming an island. More than one active device may be embedded in the silicon, space permitting. An entire circuit, or sub-circuit, may be embedded therein, thus allowing each active device embedded to be thermally isolated from the remainder of the substrate.

In accordance with a second broad aspect of the present invention, there is provided a thermally-isolated microstructure in a semiconductor chip comprising: a top layer comprising at least one patterned dielectric film; and a base having: a mass of mono-crystalline silicon adhering beneath the top layer and defined by a plurality of etched surfaces angled inwardly with respect to the top layer; a bulk of mono-crystalline silicon formed from a slab of mono-crystalline silicon and defined by a plurality of etched surfaces angled inwardly with respect to the top layer in an opposite direction to the mass; and a waist of width $[W_x^*, W_y^*]$ connecting the mass to the bulk of mono-crystalline silicon.

In some cases, the desired waist size is obtained when silicon has been completely etched away from beneath the supporting arms of the microstructure. Alternatively, it may be required to prolong the etching slightly after the support arms have been completely etched in order to reach the desired waist size.

In accordance with a third broad aspect of the present invention, there is provided a thermally-isolated microstructure suspended above a cavity in a semiconductor chip, comprising a top layer comprising at least one patterned dielectric film, and a mass of mono-crystalline silicon adhering beneath the top layer, wherein the hanging mass is fully electrically-isolated from a slab of mono-crystalline silicon beneath the microstructure.

In accordance with a fourth broad aspect of the present invention, there is provided a method for designing at least one thermally-isolated microstructure in a semiconductor chip, the method comprising: (a) determining a size and configuration of the at least one microstructure; (b) identifying parameters of dry-etch depth ($D_{dry}$) and wet-etch depth ($D_{wet}$) for the at least one microstructure in accordance with step (a); and (c) designing a patterned dielectric film on a slab of mono-crystalline silicon in accordance with steps (a) and (b).

The configuration of the microstructure is the design of the base of the microstructure. For example, whether it will be a waisted structure, a silicon island, or a platform with no silicon adhering beneath the dielectric film. The configuration also includes the choice of having a cantilever structure with a pair of arms, a waisted structure with support arms, or the absence of these arms. The size of the microstructure includes the length and width of the top layer, as well as the dimensions of the waist. The determination of the configuration may also include providing a patterned dielectric film having a plurality of regions, alternating regions of varying width, and different layouts for these regions, such as linear, two-dimensional, etc. In the case of a microstructure with more than one region, each region may be designed separately and have its own configuration, such as waisted, silicon island, or absence of silicon.

In accordance with a fifth broad aspect of the present invention, there is a provided a method of fine-tuning a diffusion of dopants in a thermally-isolated microstructure. A thermally-isolated microstructure is fabricated using the hybrid dry-then-wet etching process described herein. During the fabrication process, at least one dopant diffusion is embedded in the silicon mass. A heater, such as a polysilicon resistor embedded within the dielectrics, or a diffused resistor in the silicon mass, is provided with electrical connections such that electric power can be applied to heat the microstructure at least by several hundred degrees Celsius. A heat pulse is applied to the microstructure and an electrical property of the circuit which is affected by the diffusion is measured (or the diffusion itself is measured). This becomes an iterative process until a desired result is reached.

In accordance with a sixth broad aspect of the present invention, there is provided a thermally-isolated microstructure with a post-fabrication fine-tunable diffusion dopant profile. The microstructure has at least one dopant diffusion embedded in a mass of silicon adhering to the underside of a top layer of a patterned dielectric film. A heater is also embedded in the mass of silicon. The heater has electrical connections to allow electric power to be applied to heat the microstructure to a temperature high enough to such that significant dopant diffusion is enabled, which happens at high temperatures such as several hundred degrees Celsius.

In this case, the microstructure is either absent of any metal (in the case where the silicon mass is fully-electrically-isolated during the etch process, and the electrical connections to any on-microstructure electrical components are made off-microstructure, or are made on-microstructure by heavily-doped polysilicon), or has metal which is compatible with the high temperature that must be reached to diffuse the dopants.

Some of the advantages gained from the present invention are that the likelihood of damage to the microstructure during the release process is reduced, better temperature uniformity is obtained in the released microstructure, it becomes possible to embed a temperature sensor in the silicon, and active electronic devices can also be embedded and thermally-isolated, all without needing to use an electrochemical etch process. Another advantage is the ability to control and design the thermal isolation of the microstructure in the case where the microstructure is still attached to the silicon but has a narrow waist portion. Yet another advantage of waist-shaped ("waisted") microstructures is relevant in the case where external forces (such as from packaging processes or materials), are applied to the chip. In that case devices (e.g. diodes, transistors, resistors) positioned at the surface of the microstructure will be subject to significantly less stress than there would have been if there were no cavities in the silicon.

In this specification, the term "semiconductor chip" is intended to mean a chip such as used to house integrated circuits with semiconductor devices, such as a silicon chip, or a chip made from a silicon-on-insulator (SOI) wafer. In an SOI wafer, the techniques described herein are to be understood as being applied in the top semiconductor (silicon?) layer Furthermore, the term "tempco" is intended to mean temperature coefficient, such as temperature coefficient of resistance, temperature coefficient of output voltage, etc.

BRIEF DESCRIPTION OF THE DRAWINGS

Further features and advantages of the present invention will become apparent from the following detailed description, taken in combination with the appended drawings, in which:

FIG. 1 (prior art) shows a microstructure suspended over a cavity in a silicon wafer (a) top view, and (b) cross-sectional view through A-A in FIG. 1a;

FIG. 5b is a cross-sectional view through line X-X of FIG. 5a;

FIG. 7b is a cross-sectional view through line X-X of FIG. 7a;

It will be noted that throughout the appended drawings, like features are identified by like reference numerals.

DETAILED DESCRIPTION

There is described herein a method which alleviates the problems related to conventional island-etching techniques. Instead of simply a wet anisotropic etch, an approach is used consisting of a hybrid vertically-anisotropic dry etch followed by a wet anisotropic etch. The progress of microstructure release may be altered such that the likelihood of cracking and damage is significantly reduced. A dry etch of silicon is done first, of the type which creates deep vertical silicon walls, followed by a wet etch which creates inverted sidewalls in the cavity. The "release" of the suspended structures from the slab of mono-crystalline silicon occurs with a large mass of rigid silicon adhering to the underside of the microstructures, and these masses prevent the most severe bending until a time when it can be better accommodated.

FIGS. 4a-e depict the hybrid etch process for a {100} silicon wafer. Consider a cantilever similar to the one shown in FIG. 3, consisting of relatively narrower support arms (which are intended after full release to remain connected to the substrate at the outer edge of the cavity), and a wider main region. In FIG. 4, these two regions are depicted as being side-by-side for drawing convenience, even though in FIG. 3 the two regions are arranged differently. The deep silicon etch (FIG. 4a), is masked by the microstructure strips themselves (the silicon is deep-etched where the microstructures are absent). The depth of the deep etch should be designed to be at least approximately [($\sqrt{2}$)*(the width of the widest microstructure intended to be released)]. The reason for this appears in FIG. 4c, where the inverted {111}-family surfaces etching from both sides of the widest microstructure must meet (intersect), before a situation is reached where only {111}-family surfaces will be exposed in those regions, (and thus where the etch rate would slow down dramatically).

Figure 1A:
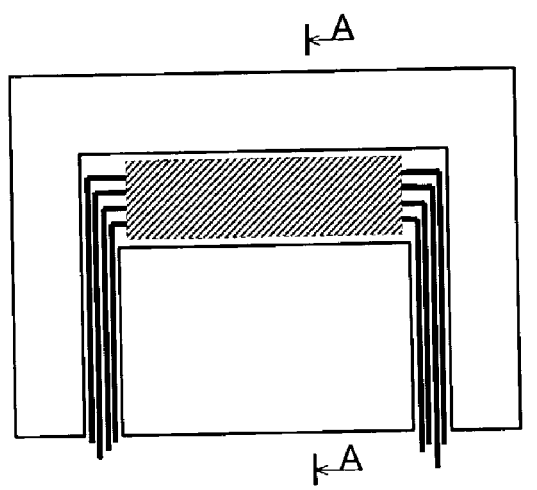
Figure 1B:
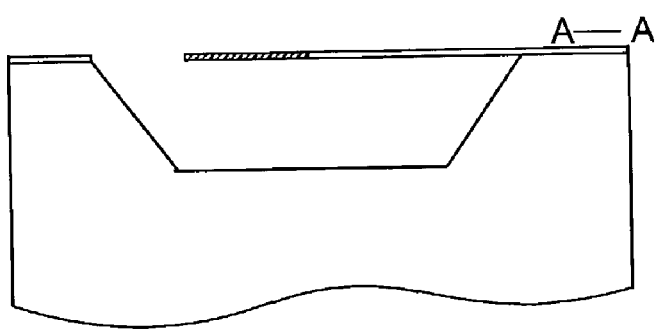
Figure 2:
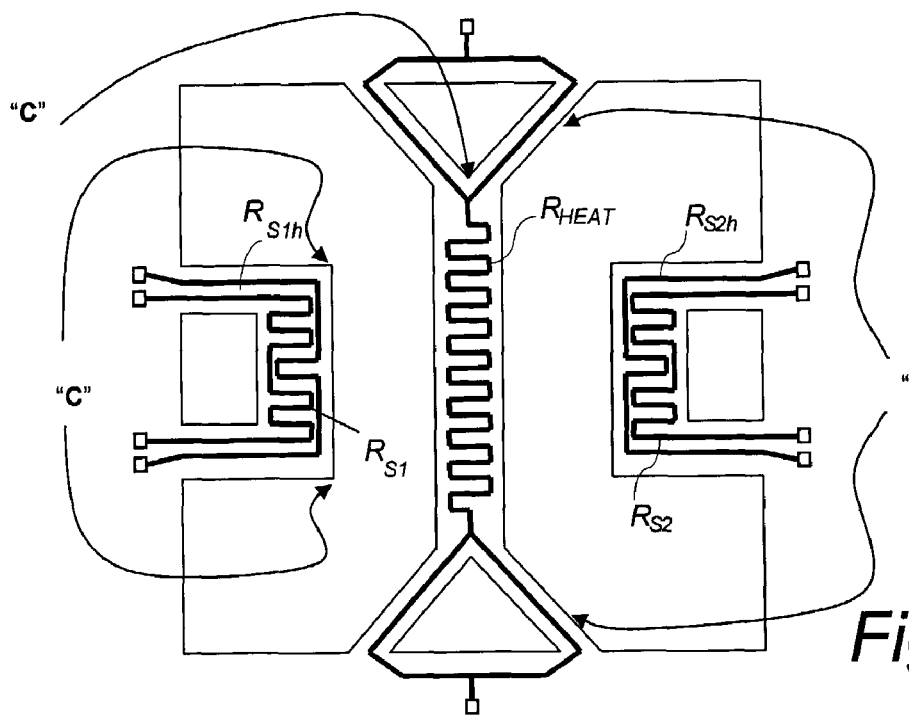
FIG. 2 shows a top view of several microstructures suspended over a cavity in a {100} silicon wafer, indicating the locations of convex features and other fast under-etching locations.
Figure 3:
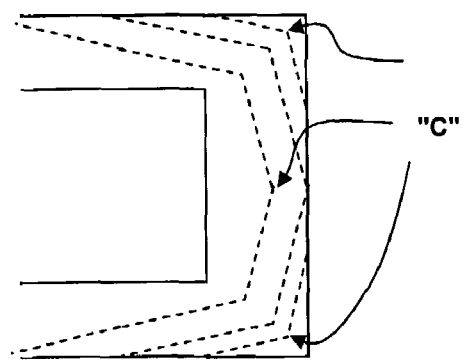
FIG. 3 shows how convex corners of silicon beneath a suspended microstructure advance during wet anisotropic etching of a {100} silicon wafer.

During the full release and removal of all silicon adhering to all suspended microstructures, for a cantilever such as shown in FIG. 3, there are several noteworthy points. At the beginning of the wet-etch (after the vertical-walled dry etch), the vertical walls "E" ({110}-family surfaces, relatively fast-etching), will be etched at an etch rate ER(<110>) ("wet-etch rate of a <110> direction" in the silicon crystal lattice). At the top and bottom of most of the sidewalls, slow-etching {111}-family surfaces will immediately appear. At the convex corners (points "C" in FIG. 3), etching will again proceed rapidly (typically faster than ER(<110>)), and microstructure bending may occur. The first event of "release" will be the separation from the slab of mono-crystalline silicon beneath the narrower arms "F" (depicted in FIG. 4b). This will happen when the wet-etch distance in the <110> direction, $D_{wet<110>}$, has reached $W_2/2$, which will be at wet-etch time $W_2/2ER(<110>)$. Note that, at this juncture, the narrower arms still have silicon adhering to their undersides, and the wider portion of the cantilever will still be held connected to the slab of mono-crystalline silicon. Next, the silicon adhering beneath the narrower arms will be etched away quickly (by fast-etch surfaces, having etch rate typically faster than ER(<110>), which appeared at the convex location where the upper silicon was separated from the slab of mono-crystalline silicon). It is possible, depending on the difference in widths of the two arms, that this adherent silicon will be completely removed before the wider portion is separated from the slab of mono-crystalline silicon. If so, the narrower arms will most likely remain flat through this phase of the release, without significant bending. Next, (in FIG. 4c), when the wet etch has been ongoing for the length of time needed to etch a {110} surface by a distance $D_{wet<110>}=W1/2$ (at a wet-etch time W1/2ER(<110>)), the wider portion will be separated from the slab of mono-crystalline silicon "H". At this time, the entire cantilever will be separated from the slab of mono-crystalline silicon, and thus it may bend, upward or downward, governed by the stresses in the microstructures, and the bending would be strongly influenced by these stresses. For example, if the narrower arms have no adherent silicon, then they are free to flex. Note that in this case this bending will be dominated by simple flexing of the narrower arms on a common axis, instead of creasing which may occur when bending occurs simultaneously on more than one axis. Finally, if the device is left in the etchant for long enough, the silicon adhering to the bottom of the wider portion will eventually be fully removed. This will proceed by etching of fast-etch surfaces, at the corners "C" as described In FIG. 3, but also at fast-etch surfaces "I" as shown in FIG. 4d. Since the depth of the cavity is typically smaller than the lateral length of the microstructure, for most of the length of the wider portion the final release will be dominated by these fast-etch surfaces "I" illustrated in FIG. 4d. Thus most of the wider portion will be fully released approximately simultaneously, without the establishment and maintenance of severe creases such as might have appeared if the etch were wet-only. Furthermore, at the end of the release, any sharp-pointed silicon rigidly connected to the slab of mono-crystalline silicon is far removed at the bottom of the cavity.

Note also several other advantageous aspects: (1) The time in the wet anisotropic etchant is reduced by this method. (2) The outside of the outer circumscribed rectangles does not suffer. There are inverted {111}-family surfaces underneath the outside edges of the cavity, but since the etch at those locations is governed by slowest-etching {111}-family surfaces, the etch will not undercut the mask appreciably, immediately beneath the mask material.

In the present invention, if the goal is to create a thermally-isolated silicon device (instead of simply a suspended microstructure composed of surface dielectric films with embedded conductors), then one can execute the process described above (including the initial steps of FIG. 4), but stop short of complete release. One would stop the process approximately between FIG. 4c and 4d, (perhaps as soon as possible after FIG. 4c). In this case, there would remain a thermally-isolated mass of silicon adhering beneath the suspended films, roughly depicted in FIG. 5. The cross-sectional diagram in FIG. 5b illustrates that the block of silicon may be defined by a variety of sub-surfaces, including specific regions of {111}-family surfaces as well as other regions covered with a variety of rougher faster-etching surfaces "I".

Figure 5A:
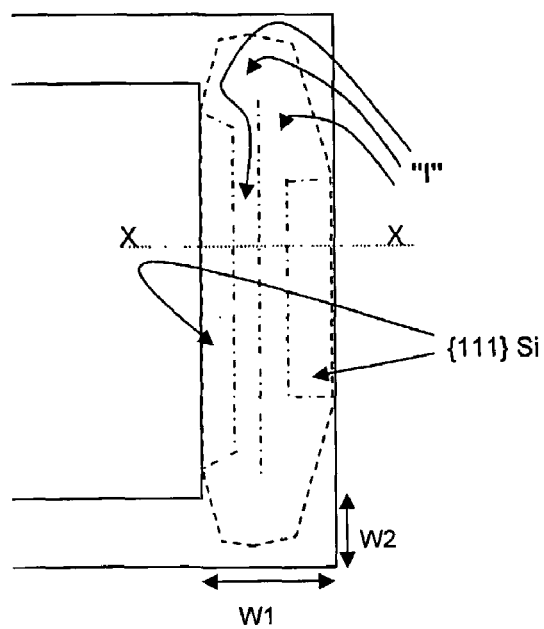
FIG. 5a shows a typical two-legged cantilever-shaped microstructure, with legs narrower (W2) than the main portion (W1), such that at approximately between steps (c) and (d) in FIG. 4, there remains some silicon adhering to the wider portions of the microstructure.
Figure 5B:
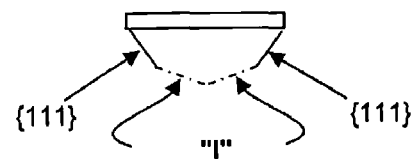

FIG. 5b illustrates a thermally-isolated microstructure suspended above a cavity in a semiconductor chip, comprising a top layer having at least one patterned dielectric film, and a mass of mono-crystalline silicon adhering beneath the top layer, wherein the mass is fully electrically-isolated from a slab of mono-crystalline silicon beneath the microstructure. Fully electrically-isolated should be understood as meaning not having an electrical connection to do chemical etching. However, embedded devices may have a connection for purposes of functionality. The electrical connection provided to these embedded devices cannot be used to do chemical etching as described in the prior art. These electrical connections may be metal, or alternatively, heavily doped polysilicon, leading to a thermally-isolated microstructure completely void of any metal.

Note that the etch time at which FIG. 4c occurs, when the silicon island above is just beginning to be separated from the silicon below, is not well-defined for the entire length of the microstructure. Instead, there will be a first breakthrough at a single point, and at this time a gap is created from one side to the other. At the point of this breakthrough, all interior surfaces of the gap are convex and therefore rapid etching will occur upward, downward and sideways, at such points. Therefore, the fast etching surfaces on the bottom of the adherent silicon will be rough. Furthermore, since it is a case of rapid etching after slower etching, the amount of time after the breakthrough is not easy to measure and control. For these reasons, the exact sizes of these adherent silicon masses may not be easy to control.

The corners of this block would have no silicon underneath, due to convex-corner etching. If it is important to have well-shaped silicon corners at the corners of the cantilevers, then one may add convex-corner compensation shapes, as outlined in the prior art on this topic (H. L. Offereins, K. Kuhl, H. Sandmeier, "Methods for the Fabrication of Convex Corners in Anisotropic Etching of (100) Silicon in Aqueous KOH", Sensors and Actuators, Vol. 25-27, pp. 9-13 (1991); K. P. Wu, W. H. Ko, "Compensating Corner Undercutting in Anisotropic Etching of (100) Silicon", Sensors and Actuators, Vol. 18, pp. 207-215 (1989)).

Creation of a silicon island, such as described above, can be used to obtain better thermal uniformity for thermally-trimmable resistors, provided one can tolerate slower trimming time (due to the larger thermal mass).

The suspended silicon islands created using the hybrid dry-and-wet method are suitable for housing of active silicon integrated devices or circuits, such as diodes, transistors, op-amps or voltage references. These devices can be defined (created) in the (to-be-released) silicon during a host integrated circuit process which would be executed prior to the release etch. Such active devices housed on the island can be electrically connected to other devices on the chip through conductors embedded in or on the microstructure support arms.

Along with or without the active devices (such as semiconductor devices, trimmable or non-trimmable), heater-resistors and temperature sensors can also be housed on the same silicon island, in order to heat the island and measure the temperature on the island. Since the majority of the thermal mass in the island is dominated by the silicon mass, and since silicon is a relatively effective thermal conductor, the silicon mass will act to make the temperature distribution more uniform throughout the island.

Note that the width of a particular dielectric microstructure determines at what time during the etch process the silicon is removed from adhering beneath it. If two microstructures have slightly different widths (for example, ($W_1$) and (slightly less than $W_1$)), then if the etch were stopped at approximately FIG. 4d, then the resulting silicon masses which would remain adhering to the underside of the dielectrics, would have different sizes. The smaller-width microstructure would retain a smaller silicon mass at the moment that the etch ended.

A thermally-isolated device, as created above, is well suited for measuring the absolute tempco of a circuit output, or component, parameter, etc, simply because one can readily embed a stable temperature sensor (one or more) in the island as part of most host semiconductor processes. Since the silicon island acts as a very good thermal conductor, the temperature will be relatively uniform, even if the heater(s) is(are) non-symmetrically placed on the island. Of course, it is best to design the heater(s) such that the temperature distribution is spatially constant. This needs only (1) a thermally-isolated island; (2) a heater, which can be for example a polysilicon resistor (which need not be particularly stable over time and use); (3) a device which can be calibrated and is stable enough to measure temperature on the island. This could be for example a stable (non-trimmable) resistor material, or a pn-junction-based temperature sensor.

Relative Tempco-Measurable Device on a Silicon Island: With measurement of absolute tempco of a device (or parameter, etc.), you can also obtain relative tempco measurement of two or more devices on the island, without severe requirements on symmetry. Even if a stable accurate measurement of temperature is not available, the relative tempco of a circuit device/output/parameter is still available, simply by using an on-island heater to heat the island and the devices on it to a given temperature. Zero-crossing TCR is also available, in the same way as in WO 2004/097860 and WO 2004/083840.

Thermally-Trimmable Device on a Silicon Island: With a thermally-trimmable resistor in a circuit (not necessarily thermally-isolated), one can make a thermally-trimmable circuit. The thermally-trimmable resistor (and perhaps parts of the circuit as well) can be located on the island. But with substantially the entire circuit located on the thermally-isolated island, one can also measure absolute or relative tempco of the circuit (or parts of it), and therefore use the trimmable resistor to trim the temperature behaviour of the overall circuit (e.g. an output of the circuit).

Also, one need not trim only resistors, one can also use the high temperatures available from a heater-resistor in a thermally-isolated island to thermally anneal active devices (e.g. a diffused resistor, or diode or transistor characteristics), to trim their performance.

Tempco Matching and Conditioning of a Diffused Resistor in a Silicon Island: A resistor in the bulk of the silicon crystal (called a "diffused resistor), is typically made by incorporating the dopant into the silicon by ion implantation or by diffusion from films deposited on the surface of the wafer. For typical semiconductor process doping levels ($10^{15}/cm^3$ to $10^{19}/cm^3$), such diffused resistors typically have positive TCR. The resistivity of diffused resistors, for non-compensated extrinsic doping of either n-type or p-type, is given by the formula $\rho=1/[$(the electronic charge constant)*(carrier mobility)*(carrier concentration)$]$. Since, for extrinsic doping, the carrier concentration is roughly constant with temperature at temperatures within a few hundred degrees Celsius of room temperature, the TCR is determined primarily by changes in the carrier mobility. As the temperature rises, the carrier mobility naturally decreases, giving an increased resistivity (positive TCR).

A variety of TCR's, including positive TCR's of up to several thousand ppm/K, are available in resistors made from thin film materials such as polysilicon. These films having substantial positive TCR's may be TCR-matched to diffused resistors. A heater positioned on the island such that the temperature is substantially the same at the polysilicon resistor and diffused resistor, would allow measurement of relative tempco of the two resistors, and thus allow trimming of the resistance and/or TCR of the thermally-trimmable material to match (or intentionally mismatch) the diffused resistor.

Furthermore, since the heater can reach temperatures in the neighborhood of 1000° C., this can cause diffusion of dopants in the silicon. Thus, the resistance (and TCR) of a diffused resistor embedded in a silicon island may be trimmed in this way.

As another example, one can arrange a heavily-doped polysilicon layer to be in contact with the silicon surface, and use an on-island heater to diffuse the dopant into the silicon (such as in the emitter of a bipolar transistor).

The silicon island may contain integrated components, even an entire integrated circuit (or sub-circuit of a larger electronic system). For example, one may design certain critical components (active and/or passive) of a circuit to be on a silicon island (perhaps because the entire circuit may be too large to fit practically on an island). This circuit may include thermally-trimmable resistors.

Figure 6A:
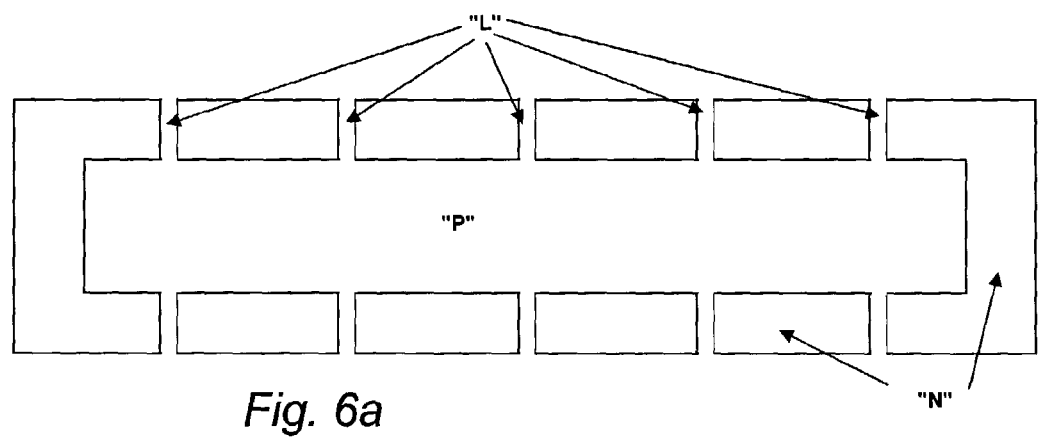
FIG. 6a shows an example of a long and narrow silicon island, supported on both sides by narrower support arms.

Note that many variations of circuit designs having silicon islands are possible. FIG. 6a shows an example of a long and narrow silicon island, supported on both sides by narrower support arms "L". By stopping the process roughly at FIG. 4d, the support arms would have no silicon adhering beneath, while the main central region "P" would have a large silicon island adhering beneath. The regions between the island "P" and the support arms "L" are open regions "N" where silicon has been etched away.

Figure 6B:
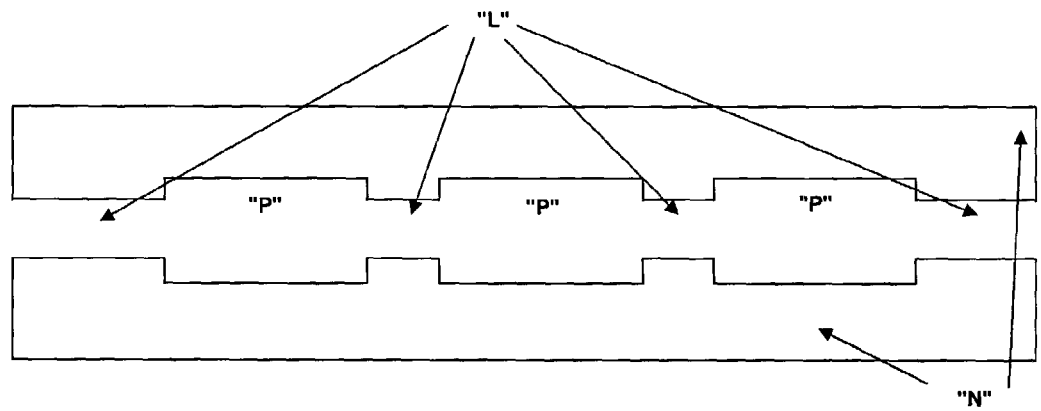
FIG. 6b shows, in a single microstructure, alternating regions having width W1 and W2, thus creating several silicon islands suspended under a common support.

Furthermore, in a single microstructure, one can have alternating regions having width $W_1$ and $W_2$, thus creating several silicon islands "P" suspended under a common support. An example showing three silicon islands "P" arranged in a linear pattern is depicted in FIG. 6b. Such an arrangement could be used to create a very uniform temperature in the central island. Symmetric and otherwise identically-designed heaters could be positioned in the two outer islands, allowing heat to flow symmetrically to the central island from both sides. Since the central island is itself a separate thermal mass with high thermal conductivity, the temperature in the central island would be more uniform than it would be if it had no silicon mass adhering beneath.

Figure 6C:
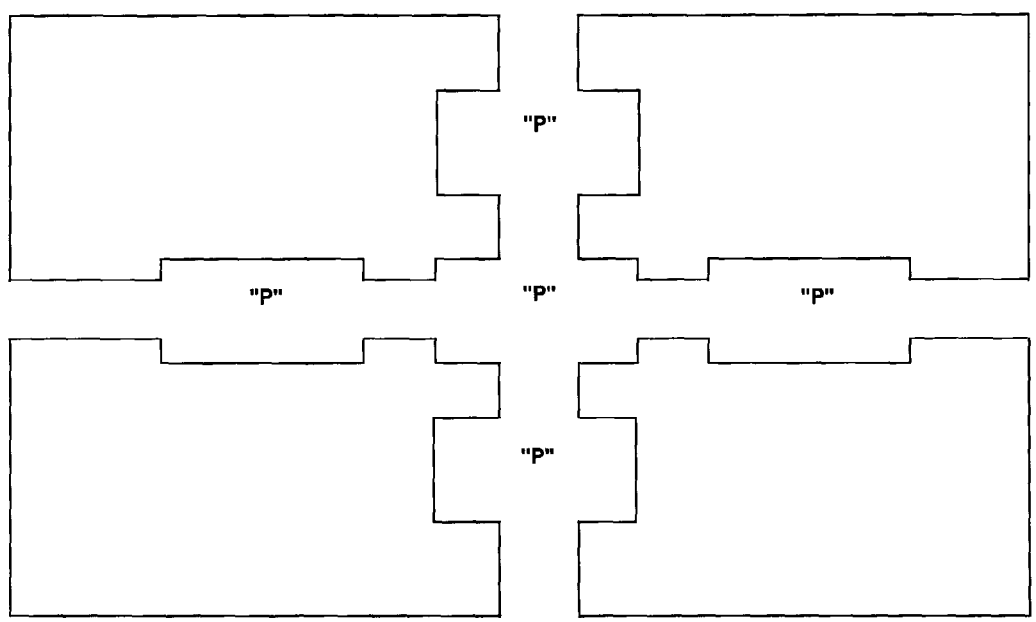
FIG. 6c shows another example of a realizable structure, where the islands are arranged in a 2-dimensional array.

FIG. 6c shows another example of a realizable structure, where the islands "P" are arranged in a 2-dimensional array.

Figure 7A:
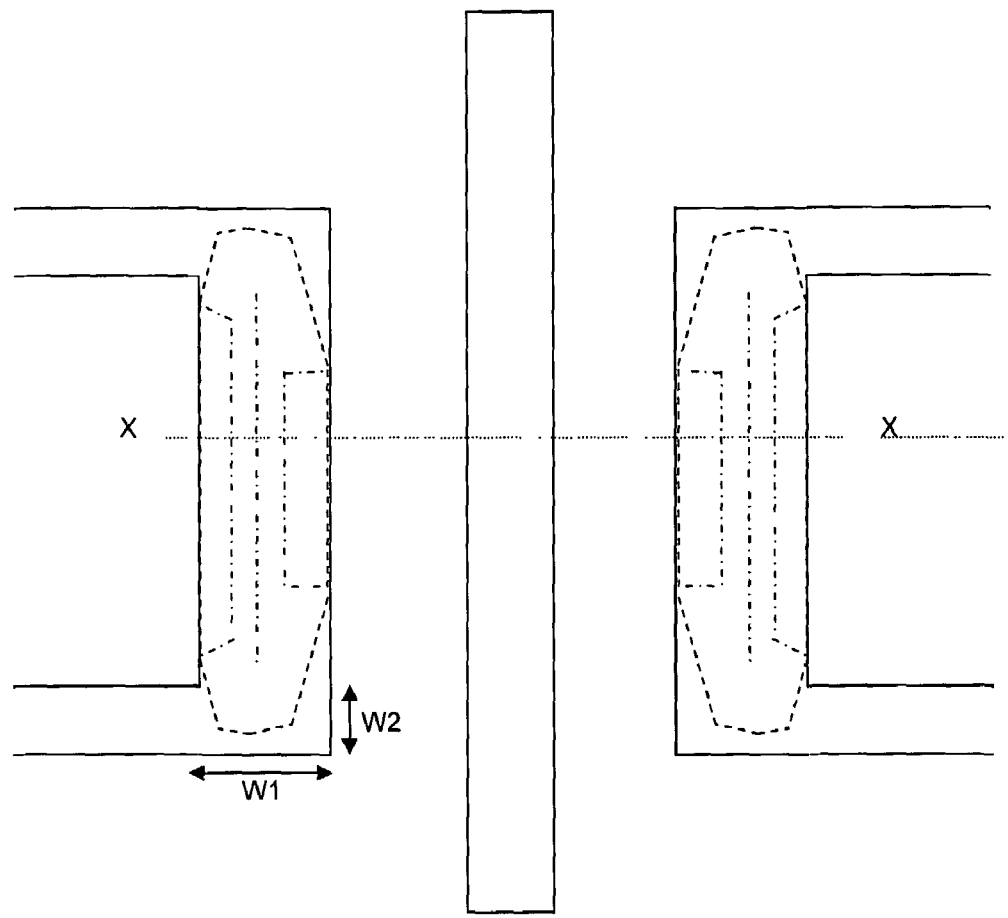
FIG. 7a shows a pair of typical cantilevers as shown in FIG. 5, with another strip of suspended microstructure between them.
Figure 7B:
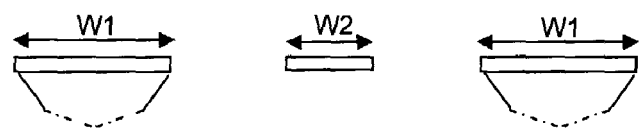

Another possibility of a configuration for devices is shown in FIG. 7. There can be thermally-trimmable devices on each of the islands, positioned symmetrically around a central microstructure, on which there may be a heater to symmetrically heat the two adjacent islands. One may also place measure-only components on one island, and to-be-trimmed components on another island.

Figure 4A:
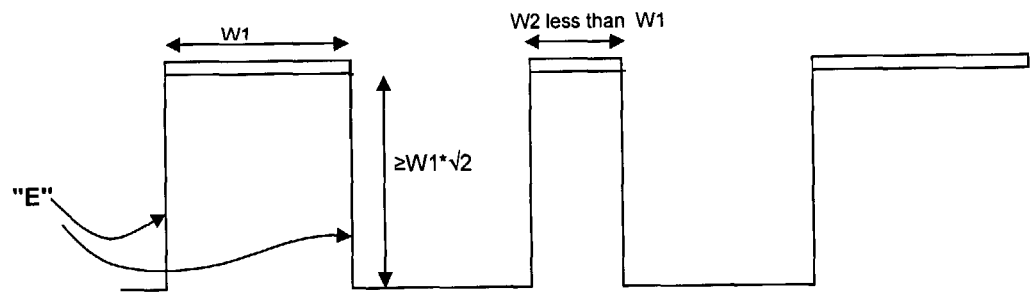
FIGS. 4a to 4e show the sequence of hybrid dry and wet etching of silicon and the changes to the microstructure after each step.
Figure 4B:
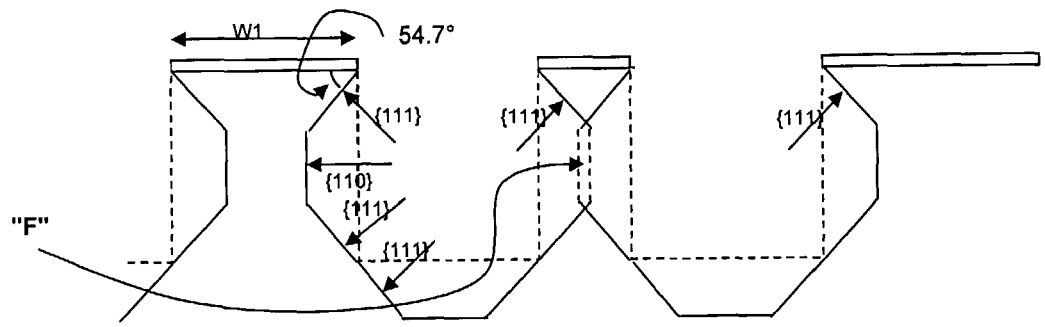
Figure 4C:
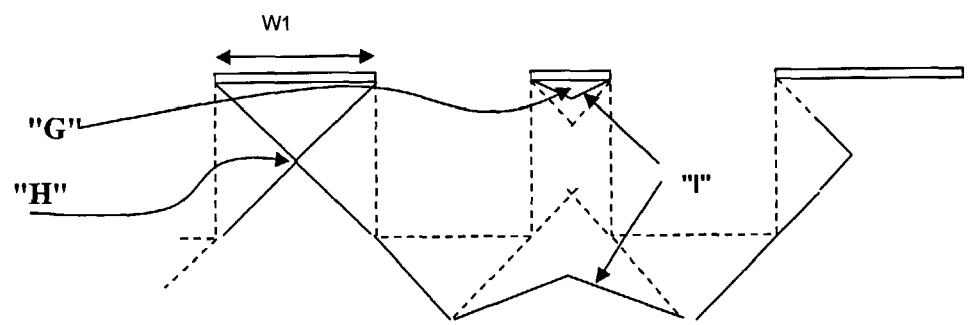
Figure 4D:
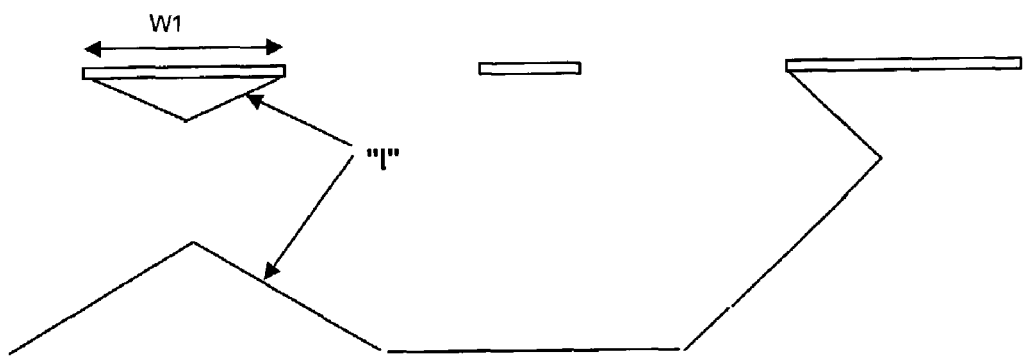
Figure 4E:
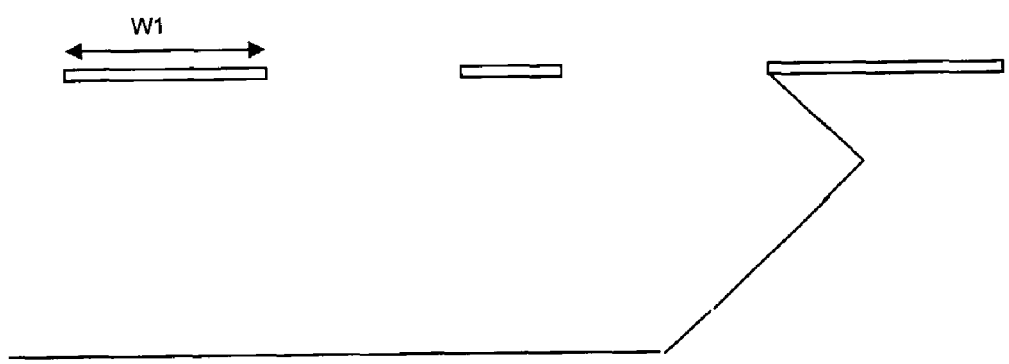
Figure 8:
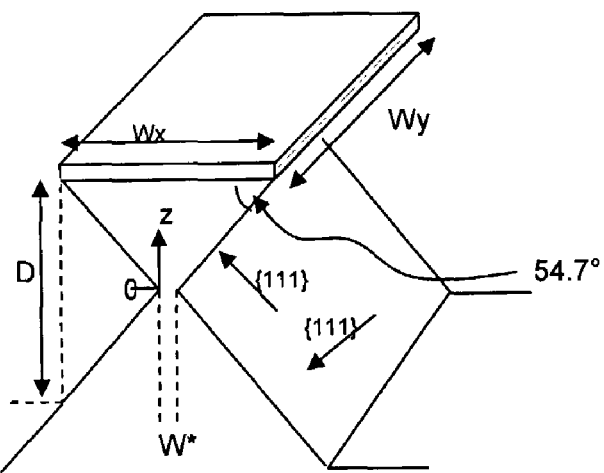
FIG. 8 shows a waisted structure, obtained by following the process depicted in FIG. 4, up to a point between 4b and 4c.
Figure 9:
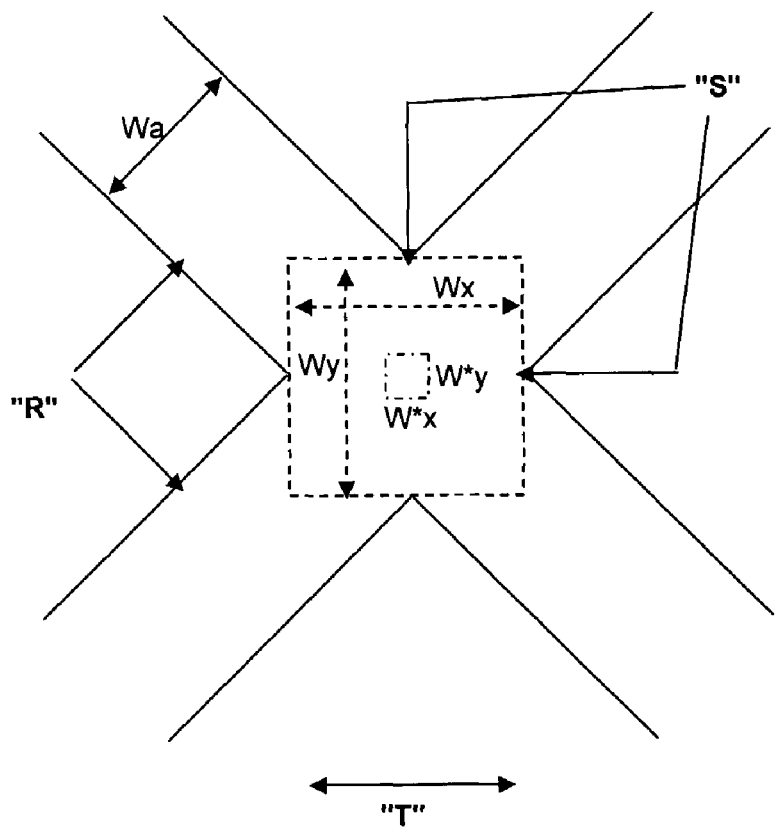
FIG. 9 shows the (top view) mask pattern (patterned dielectric film) needed to obtain another waisted structure, again by following the process depicted in FIG. 4, up to a point between 4b and 4c.

FIG. 8 shows a partial view of a silicon structure, equivalent to a structure between FIG. 4b and 4c—a precursor to an island, having controllable intermediate thermal isolation (where the thermal isolation of the island is designed by planning of the relationship of the width $W_x$, length $W_y$, and the dry etch depth, $D_{dry}$). The depth, $D_{dry}$, of the dry etch, immediately prior to the beginning of the wet etch, should equal $[(W_x-W^*_x)^*(\sqrt{2})]$, where $W^*_x$ is the desired minimum width of silicon (the "waist"), which is to remain after the etch has dramatically slowed when the {111} surfaces intersect at the waist.

The structure shown in FIG. 8 has a top layer with at least one patterned dielectric film. It's base has a mass of mono-crystalline silicon adhering beneath the top layer and defined by a plurality of etched surfaces angled inwardly with respect to the top layer. A bulk of mono-crystalline silicon is formed from a slab of mono-crystalline silicon and is defined by a plurality of etched surfaces angled inwardly with respect to the top layer in an opposite direction to the mass. A waist of width [Wx*, Wy*] connects the mass to the bulk of mono-crystalline silicon.

Calculation of thermal isolation, G (K/mW), where $\Delta T = G^*$(applied power in mW): Assume that the thermal conductivity of the slab of silicon is approximately 1 W/cm·K=1000 mW/cm·K. Assume also that all of the heat generated at the surface of the microstructure is conducted down to the slab of mono-crystalline silicon through the base, itself, and that heat loss is negligible by any other path or mechanism. Assume also that in the silicon at a given height, z, the temperature is approximately constant over both horizontal dimensions, x and y. For this calculation relative to FIG. 8, assume also that $W_y \gg W_x$, $W_y \gg D_{dry}$, such that $W_y \approx W_y + D_{dry}/2$.

Then: 
$$G = \frac{1}{1000} \times (2) \times \int_0^{W_x/\sqrt{2}} \left[ \frac{dz}{W_y \left( W_x^* + (z/\sqrt{2}) \right)} \right]$$
$$= \frac{2}{1000 \times W_y} \times \ln\left( \frac{W_x^* + 0.5 W_x}{W_x^*} \right)$$

For an example where $W_y$=120 um, $W^*_x$=5 um, $W_x$=40 um, this G is ≈0.3K/mW.

Consider another case, corresponding to FIGS. 9 to 13. $W_a$=width of the microstructure arms, oriented at 45° to the <110>-directed wafer flat "T"; $W_x$=desired width (x-direction) of the main section of the microstructure; $W_y$=desired width (y-direction) of the section of the microstructure; $W^*_x$=desired width (x-direction) of the silicon at its narrowest point (the "waist"); $W^*_y$=desired width (y-direction) of the silicon at its narrowest point (the "waist").

For the structure in FIGS. 9 to 13, at the beginning of the wet anisotropic silicon etch, after the dry silicon etch is completed, due to the crystallography of the silicon crystal structure, the silicon underneath the microstructure support arms will be bounded by vertical-walled {100}-family surfaces "R". The wet anisotropic etch will begin by etching these vertical {100} surfaces inwards on both sides of all four of the arms, at an etch rate ER(<100>) (see FIG. 11). The arms are designed for two purposes: electrical connection to the island, and preservation of the convex edges intended to remain at the four corners of the desired waisted island.

However, at the concave intersections of these arms (where the arms join the main section of the microstructure), the etch will not pass the {111}-family surfaces which intersect the wafer surface at the larger dashed square ($W_x*W_y$) in the figure (left). Thus, at the wafer surface, the etch will stop at the dashed square indicated in FIG. 11.

Figure 12:
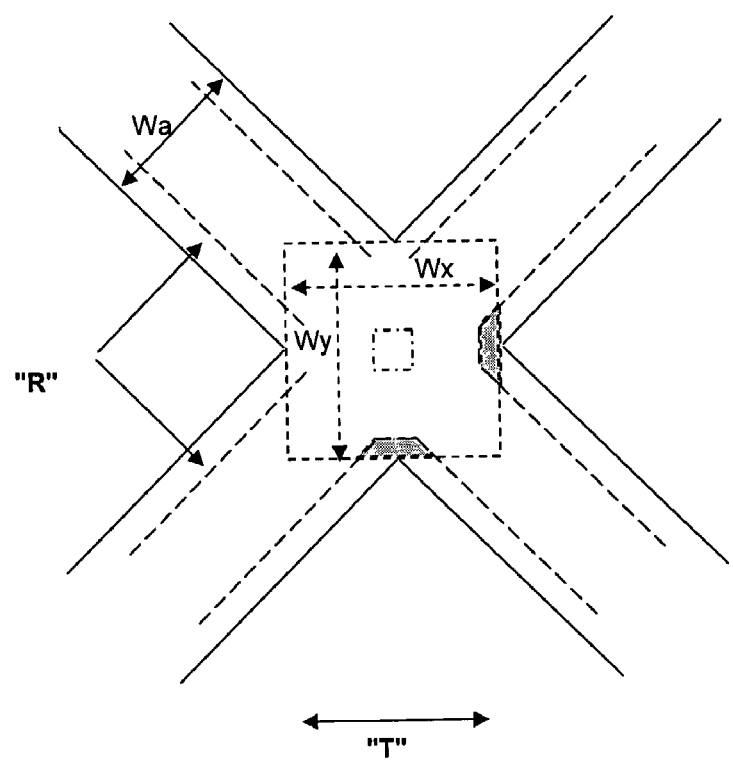
FIG. 12 shows (top view) the etch fronts underneath the patterned dielectric film edges, after a longer time than is shown in FIG. 11. Also, the shaded regions show the position of the etch front at some depth underneath the silicon surface. This position is recessed underneath the patterned dielectric film, since the {111} surfaces, which intersect the wafer surface at the dashed rectangle, are inverted.
Figure 13:
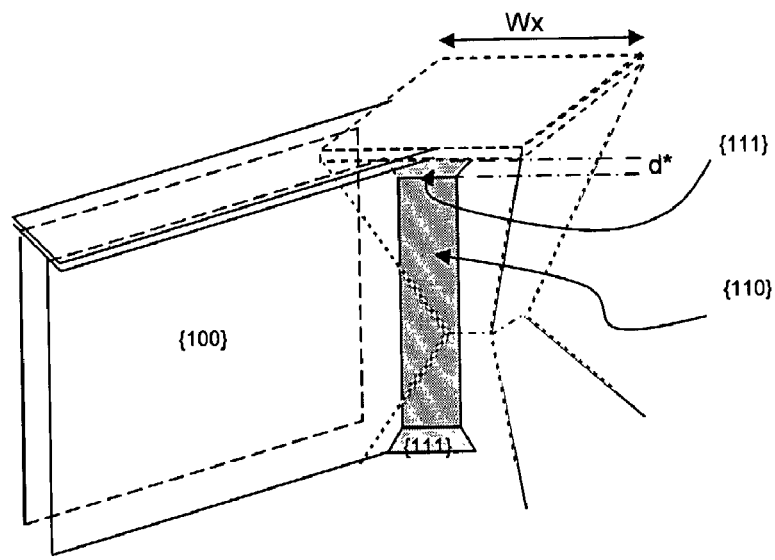
FIG. 13 shows a plan view of the structure shown in FIG. 12. The silicon walls underneath the arms are vertical {100} surfaces, and there is a vertical {110} surface advancing underneath the central portion of the microstructure. Note the inverted {111} surfaces forming near the surface underneath the microstructure.

Below the surface in the cavity, however, the <100>-directed etching will be stopped by {111} surfaces at a later juncture, as depicted in FIGS. 12 and 13. Consider the two shaded regions in FIG. 12. These shaded regions are intended to show the boundaries of the silicon surface at a depth d from the surface, after some significant wet etching has occurred. As shown in FIG. 13, a vertical surface must appear between the {100} surfaces which recede underneath adjacent support arms. This new vertical surface is roughly a {110} surface.

In order to eventually reach the waist (consisting of concave-intersecting {111} surfaces), this approximate {110} surface "S" must be etched inwardly rapidly enough such that the waist is achieved by the time the silicon underneath the microstructure support arms is completely etched through (from both sides). This etch rate ER(<110>) must be at least approximately =[ER(<100>)*√2]. If not, the silicon underneath the support arms will be completely removed before the concave-intersecting {111} surfaces are formed at the waist, leaving convex edges consisting of convex-intersecting {111} surfaces at all four corners of the remaining silicon underneath the microstructure. These convex edges will begin to etch rapidly (fast-etch surfaces will appear due to the convexity of the shape), eroding the corners of the silicon island, while there are still {110} surfaces present. The resulting silicon mass will be closer to a pillar in shape than to the desired waisted structure depicted in FIG. 10.

In general, (whether or not the waist has been formed), the wet etch must be terminated very soon after the silicon underneath the support arms is completely etched through, otherwise the island will begin to erode quickly from the corners/edges. Of course, if it is desired to create such a pillar-like structure, then one may simply let the etch proceed.

Figure 10:
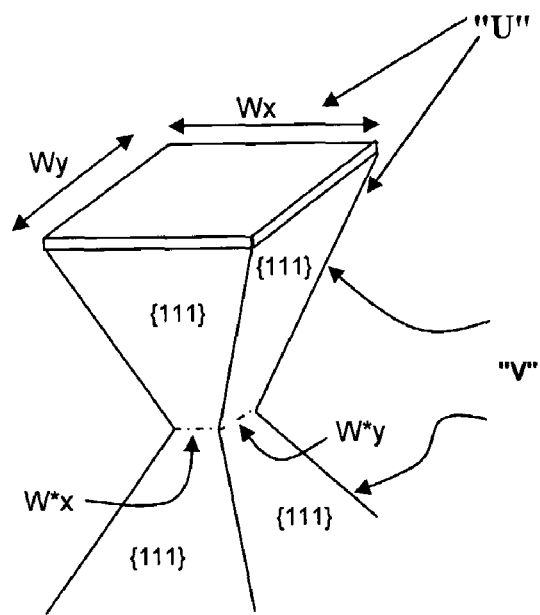
FIG. 10 shows the waisted structure resulting from the mask pattern (patterned dielectric film) in FIG. 9.
Figure 11:
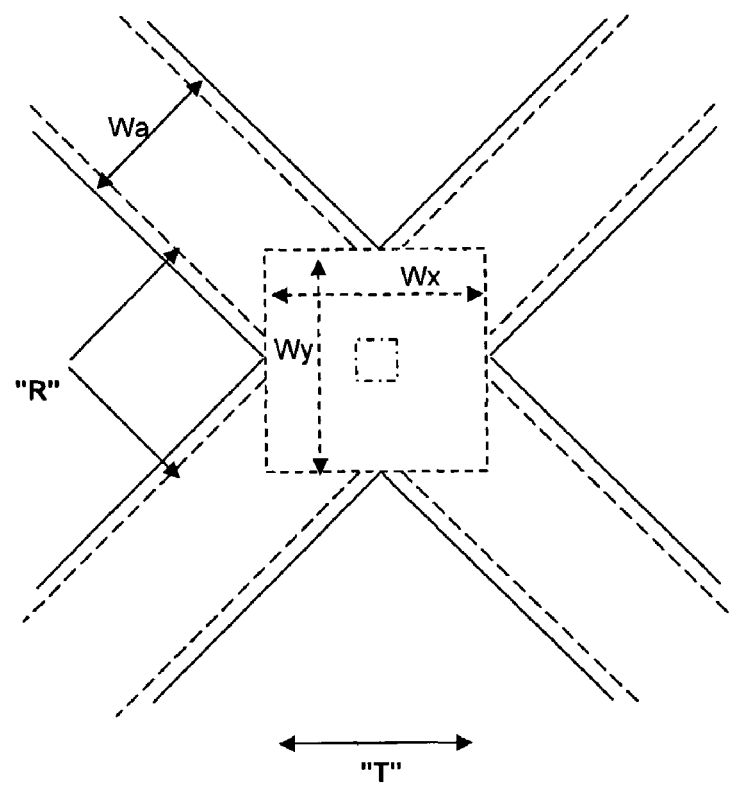
FIG. 11 shows (top view) the movement of the etch fronts underneath the patterned dielectric film edges, after a short time of wet etching. The arms are under-etched by a small but appreciable amount, while the under-etch stops at the {111} surfaces which intersect the wafer surface at the dashed square.

The initial depth, $D_{dry}$, of the dry vertical-walled etch determined the depth at which will be the narrowest points (the "waist"). This will be at a half of the initial dry-etch depth, $D_{dry}/2$. Since the structure will eventually (after <110>-directed etching of the silicon underneath the microstructure), be bounded by {111} surfaces as shown in FIG. 10, the relationship between this $D_{dry}$ and $W_x$, $W_y$, will also determine whether there can still be a "waist" (consisting of concave-intersecting {111} surfaces), present after <110>-directed etching. There can be such a waist present, consisting of concave-intersecting {111} surfaces, only if $D_{dry} < (\sqrt{2}W_x)$, and $D_{dry} < (\sqrt{2}W_y)$. The dimensions of the waist are also determined by the relationship, $W^*_x = [W_x - (D_{dry}/\sqrt{2})]$, and $W^*_y = [W_y - (D_{dry}/\sqrt{2})]$. These calculated dimensions are a maximum achievable for given values of $W_x$, $W_y$, and $D_{dry}$. In reality, the final dimensions of $W^*_x$ and $W^*_y$ may be smaller because the etch rate of {111} surfaces is non-zero, and thus the {111} surfaces may advance inward, making $W^*_x$ and $W^*_y$ smaller, especially if the structure is kept in the wet anisotropic silicon etchant for a significant time period after the waist has been established as intersecting {111} surfaces.

The above type of silicon waisted structure can be used to design a particular thermal isolation for devices (including resistors) positioned at or near the top surface of the silicon or in surface films on top of the silicon. A resistive heater can be included (for example a polysilicon resistor embedded in the surface films), as a heat source, and the overheating temperature $\Delta T$ (K) will be determined by the equation $\Delta T = G*P$, where P (mW) is the power dissipated by the heater, and G (K/mW) is the thermal isolation of the structure.

FIG. 10 shows the creation of a square waisted silicon structure. The dimensions $W_x$ and $W_y$ can be different. In order to have the thermal isolation be determined by a waist, one must remove all of the silicon underneath the support arms. Thus, it is advantageous to make all of the arms the same width, and oriented the same way (such that they are released all at the same time.) If the support arms are designed this way, a similar structure will be attained, but with different waist dimensions, $W^*_x$ and $W^*_y$.

The thermal isolation, G, of the resulting structure can be intentionally designed by specifying the dimensions of the structure. The thermal isolation is dominated by the establishment of a temperature gradient between the top surface and the bulk silicon, where the heat generated by a heater at the top surface flows mostly through the "waist" down to the bulk silicon. The thermal isolation, G, of the waisted structure can be estimated as follows: Assume that the thermal conductivity of the slab of mono-crystalline silicon is approximately 1 W/cm·K=1000 mW/cm·K. Assume again that all of the heat generated at the surface of the microstructure is conducted down to the slab of mono-crystalline silicon through the base itself, and that heat loss is negligible by any other path or mechanism. Assume also again that in the silicon at a given height, z, the temperature is approximately constant over both horizontal dimensions, x and y.

$$G \approx \left(\frac{1}{1000}\right) \times (2) \times \int_0^{D_{dry}/2} \left[\frac{dz}{(W^*_y + (z/\sqrt{2})) \times (W^*_x + (z/\sqrt{2}))}\right].$$

In the case where $W^*_y = W^*_x$, this reduces to:

$$G \approx \left(\frac{1}{1000}\right) \times (2) \times \int_0^{D_{dry}/2} \left[\frac{dz}{(W^*_x + (z/\sqrt{2}))^2}\right];$$

$$G \approx \left(\frac{1}{1000}\right) \times (2\sqrt{2}) \times (-1) \times \left[\frac{1}{W^*_x + (z/\sqrt{2})}\right]_0^{D_{dry}/2};$$

$$G \approx \left(\frac{1}{1000}\right) \times (2\sqrt{2}) \times (-1) \times \left[\frac{1}{W^*_x + (D_{dry}/2\sqrt{2})} - \frac{1}{W^*_x}\right];$$

$$G \approx \left(\frac{1}{1000}\right) \times (2\sqrt{2}) \times \left[\frac{1}{W^*_x} - \frac{1}{W^*_x + (D_{dry}/2\sqrt{2})}\right].$$

As shown in the above equations, waisted structures enable the design of a microstructure with a particular level of thermal isolation. This can be useful in cases such as functional resistors which need to dissipate a non-trivial amount of power during operation. For example, if a microstructure made from only dielectrics and embedded conductors has thermal isolation G≈30K/mW, and if a functional resistor would need to dissipate 0.2 mW in operation, that would correspond to a 6° C. temperature rise. If the TCR of that resistor is large, (e.g. 500 ppm/K), then this would cause a change in resistance of 0.3%, which may be too large for a high-precision analog circuit. In such cases, it may be desirable to design an intermediate thermal isolation, such as 2K/mW, significantly greater than if the resistor were simply positioned on the slab of mono-crystalline silicon (without special measures to enhance thermal isolation), but also significantly less than 30K/mW. With a waisted structure having $W_x = W_y = 40$ μm, and a dry etch depth $D_{dry} = 44$ μm, $W^*_x$ and $W^*_y$ will be approximately 9 μm, and the thermal isolation will be approximately 2K/mW. In this case the change in the temperature of the above-described resistor would be 0.4° C., and the change in resistance a much-reduced 200 ppm=0.02%.

Fine-tuning is possible for the thermal budget of diffused dopants in the silicon near the top of the waisted structure. More specifically, one may fine-tune the dopant profile of diffused dopants in the silicon. Since the heaters are located at the surface, during heating the temperature distribution will be such that the temperature is higher at the surface than deeper in the silicon. This will tend to enhance dopant diffusion near the surface, which will typically make the dopant distributions flatter, with respect to the vertical direction, in the main part of doped regions near the surface, while causing relatively small diffusion for dopant atoms which are located deeper in the silicon. This can be used to fine-adjust the sheet resistance of a diffused layer.

Fine-tuning of diffusion of diffused dopants may also be done on silicon islands without waists. As described above, using the hybrid dry-then-wet etching process, it is possible to obtain a metal-free microstructure. Therefore, the temperature of this metal-free microstructure can be raised to higher levels than if metal were present, thus enabling significant diffusion of dopants in silicon.

Fine-tuning of the electrical parameters of diffused resistors and other devices is also possible by lateral diffusion of dopants. Since in a waisted structure the temperature will be highest at the surface of the silicon, lateral (horizontal) diffusion will proceed somewhat faster than diffusion in the vertical direction down toward the slab of mono-crystalline silicon. Thus, such waisted structures offer an opportunity to construct devices where lateral diffusion occurs without the usual accompanying vertical diffusion that would occur if the temperature were roughly uniform throughout the relevant silicon volume.

As an example, in a diffused resistor one can arrange alternating regions of heavy-doping (low resistance) and light-doping (high resistance), such that initially the resistance will be dominated by the lightly-doped regions. Then, local annealing in a thermally-isolated silicon island (not necessarily waisted) can cause diffusion of dopants from the heavily-doped regions into the lightly-doped regions. This can effectively narrow the lightly-doped regions, and reduce the resistance. If the temperature is uniform as a result of the local annealing, the dopants will diffuse similar distances in both vertical and lateral directions, which will cause a small change in resistance. If, on the other hand, the island is waisted, lateral diffusion will be greater than vertical diffusion, and the overall change in resistance may be substantially greater than it would have been if the diffusion had been similar in vertical and lateral directions.

Overall, by designing the layout of the dielectrics to have different lateral dimensions and arrangements, one can create all of the variations described above by a single dry-then-wet sequence, in the same silicon wafer, or even potentially in the same cavity. Some narrower structures, can be designed to have width substantially less than $D_{dry}/\sqrt{2}$, such that the wet anisotropic etch will penetrate through the silicon from both sides underneath the microstructure. This will happen at a horizontal wet-etch distance $D_{wet<110>}=$(width)/2, corresponding to wet-etch time (width)/2ER(<110>), for those narrower structures. The narrowest of these structures will be released from the slab of mono-crystalline silicon first, and can have all of the adherent silicon removed first. This is accomplished by allowing the wet-etch to proceed until the fast-etch surfaces, which appear at the point of release, are all etched away. The next-wider structures can have all of their adherent silicon removed next. The wet etch can be then stopped (at a particular horizontal wet-etch distance $D_{wet<110>}$, while still-wider structures (but having width narrower than $D_{dry}/\sqrt{2}$), still have adherent silicon masses adherent beneath them. There can be several different sizes of such hanging silicon masses remaining, simply by slight differences in the designed width of the dielectrics (all narrower than $D_{dry}/\sqrt{2}$). Next, there can be structures which are wider than $D_{dry}/\sqrt{2}$, which can yield silicon structures not vertically disconnected from the slab of mono-crystalline silicon, with a "waist". Of course, there can be several different dimensions of the waist, depending on variations in the length and width of the dielectrics, and their relationship to the dry-etch depth, $D_{dry}$, assuming that the horizontal distance etched during the wet-etch in the <110> direction, $D_{wet<110>}$, is greater than $D_{dry}/2\sqrt{2}$.

It can be appreciated that the embodiments above have been described using Si{100} (and near-{100}), as it is the most straightforward because of the rectangularly arranged intersections of {111} surfaces with the {100} wafer surface, and because all of the {111} surfaces have the same inclination angle with respect to that surface (54.7-degrees, inclined and inverted). In Si{110}, there are two types of {111} surfaces, (i) which intersect the {110} wafer surface perpendicularly to the surface, and (ii) which intersect the {110} wafer surface at 35.3-degrees (inclined and inverted) to the surface. Furthermore, the vertical {111} surfaces intersect the surface in a parallelogram shape, having angles ~70.7-degrees and 109.3-degrees. The 35.3-degree {111} surfaces intersect the surface halfway in between the 109.3-degrees, so that the layout of a generic structure would be on a hexagonal grid (when viewed from an overhead view). Also, more complex structures are available, such as released non-silicon arms, adjacent to roughly-vertical-walled silicon pillars.

The embodiments of the invention described above are intended to be exemplary only. The scope of the invention is therefore intended to be limited solely by the scope of the appended claims.

We claim:

1. A method for creating a thermally-isolated microstructure in a semiconductor chip, the method comprising:
    providing a patterned dielectric film on a slab of mono-crystalline silicon;
    dry-etching to remove silicon adjacent to said patterned dielectric film, thereby creating a structure at least partially surrounded by cavities having substantially vertical walls; and
    wet anisotropic etching said substantially vertical walls inwardly beneath said dielectric film to produce inverted side walls in said cavities, and thermally isolate said microstructure, wherein said wet anisotropic etching comprises removing all silicon adhering to an underside of said dielectric film.

2. A method as claimed in claim 1, wherein said providing a patterned dielectric film comprises providing a pattern representing a platform having a set of support arms extending from every corner of the platform, whereby a presence of said support arms protects corners of the microstructure during said wet anisotropic etching.

3. A method as claimed in claim 2, wherein said support arms are positioned at 45° angles from a <110>-directed wafer flat.

4. A method as claimed in claim 1, wherein said providing a patterned dielectric film comprises providing a pattern representing a cantilever having a main section and a pair of arms, and the pair of arms are narrower in width than the main section.

5. A method as claimed in claim 4, wherein said wet anisotropic etching comprises removing all silicon adhering to an underside of said pair of arms.

6. A method as claimed in claim 1, wherein said providing a patterned dielectric film comprises providing a pattern representing a microstructure having a plurality of regions.

7. A method as claimed in claim 6, wherein said plurality of regions are alternating regions varying in width.

8. A method as claimed in claim 7, wherein said alternating regions are provided in a linear pattern.

9. A method as claimed in claim 7, wherein said alternating regions are provided in a two-dimensional array.

10. A method as claimed in claim 6, wherein said wet anisotropic etching comprises removing all silicon adhering to an underside of at least one of said plurality of regions.

11. A method for creating a thermally-isolated microstructure in a semiconductor chip, the method comprising:
    providing a patterned dielectric film on a slab of mono-crystalline silicon;
    dry-etching to remove silicon adjacent to said patterned dielectric film, thereby creating a structure at least partially surrounded by cavities having substantially vertical walls; and
    wet anisotropic etching said substantially vertical walls inwardly beneath said dielectric film to produce inverted side walls in said cavities, and thermally isolate said microstructure, wherein said wet anisotropic etching comprises etching until said dielectric film resides on a base having an upper portion beneath said dielectric film defined by a plurality of etched surfaces angled inwardly with respect to said dielectric film, a central portion adjacent to said upper portion and defined by a plurality of substantially vertical etched surfaces, and a lower portion adjacent to said central portion and defined by a plurality of etched surfaces angled inwardly in an opposite direction to said upper portion.

12. A method as claimed in claim 11, wherein said wet anisotropic etching comprises etching until a waist of a desired width $[W_x^*, W_y^*]$ is formed between a mass of silicon adhering to an underside of said dielectric film and a bulk of silicon from said slab of mono-crystalline silicon.

13. A method as claimed in claim 12, wherein said desired size $W_x^*=[W_x-(D_{dry}/\sqrt{2})]$ and $W_y^*=[W_y-(D_{dry}/\sqrt{2})]$, wherein $D_{dry}$ is a dry-etch depth.

* * * * *